(12) United States Patent
Madhira

(10) Patent No.: US 11,483,020 B1
(45) Date of Patent: Oct. 25, 2022

(54) GAIN ADJUSTMENT CIRCUIT

(71) Applicant: NXP USA, Inc., Austin, TX (US)

(72) Inventor: Sriharsha Madhira, Hyderabad (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/302,478

(22) Filed: May 4, 2021

(51) Int. Cl.
| H04B 1/10 | (2006.01) |
| H04W 4/80 | (2018.01) |
| H03G 3/30 | (2006.01) |
| H03F 3/19 | (2006.01) |

(52) U.S. Cl.
CPC ............... H04B 1/10 (2013.01); H03F 3/19 (2013.01); H03G 3/3036 (2013.01); H04W 4/80 (2018.02); *H03G 2201/103* (2013.01)

(58) Field of Classification Search
CPC .. H04B 1/10; H04W 4/80; H03F 3/19; H03G 3/3036; H03G 2201/103
See application file for complete search history.

(56) References Cited

U.S. PATENT DOCUMENTS

| 8,218,487 B2 | 7/2012 | Eliezer et al. |
| 8,983,416 B1 | 3/2015 | Spencer |
| 9,451,630 B2 | 9/2016 | Chen et al. |
| 9,900,852 B2 | 2/2018 | Shahar et al. |
| 10,587,295 B1 | 3/2020 | Dickey et al. |
| 2009/0190640 A1* | 7/2009 | Floyd ............... H03B 29/00 375/224 |
| 2014/0213235 A1 | 7/2014 | Lou et al. |
| 2020/0044814 A1 | 2/2020 | Kim et al. |

FOREIGN PATENT DOCUMENTS

| CN | 201114041 Y | 9/2008 |
| CN | 101075832 B | 7/2011 |

* cited by examiner

Primary Examiner — David S Huang

(57) ABSTRACT

A gain adjustment circuit is coupled with a transmitting device and a receiving device that are in proximity to each other. The gain adjustment circuit receives a baseband signal that is generated based on gain signals and a power associated with a reception of a data packet by the receiving device. The gain adjustment circuit further receives previous transmission information of the transmitting device. The gain adjustment circuit predicts a time of transmission of a control packet from the transmitting device and determines whether the time of transmission overlaps with a time period of reception of the data packet by the receiving device. The gain adjustment circuit further generates and provides gain signals to the receiving device such that a signal interference during the transmission of the control packet and the reception of the data packet is mitigated.

20 Claims, 8 Drawing Sheets

GAIN ADJUSTMENT CIRCUIT

BACKGROUND

The present disclosure relates generally to communication systems, and, more particularly, to adjusting gain signals of a device that is in proximity with another device.

In communication systems, various communication devices (e.g., Bluetooth devices and wireless local area network devices) that transmit or receive packets may be in proximity. In one scenario, if one communication device (i.e., a transmitting device) is transmitting a control packet, another communication device (i.e., a receiving device) that is in proximity with the transmitting device, may be receiving a data packet. In such a scenario, signal interference occurs when the control packet is being transmitted by the transmitting device and the data packet is being received by the receiving device in the same time interval.

A known technique to reduce the signal interference due to the proximity of devices is to amplify a reception power associated with the reception of the data packet by the receiving device and generate an output signal. To amplify the reception power, a gain controller provides gain signals with high gain values to the receiving device when the reception of the data packet is initiated. However, due to the high gain values of the gain signals, a signal-to-noise ratio of the output signal is degraded. In addition, signal interference causes corruption of the data packet. Therefore, there exists a need for a technical solution that solves the aforementioned problems of signal interference between communication devices that are in proximity.

SUMMARY

In an embodiment of the present disclosure, a gain adjustment circuit is disclosed. The gain adjustment circuit comprises circuitry that can be configured to receive a narrow band signal from a first device. The baseband signal can be generated by the first device based on first and second gain signals and a power signal associated with a reception of a first data packet by the first device. The circuitry of the gain adjustment circuit can be further configured to receive first state information from a second device. The first state information can include previous transmission information of the second device. The circuitry can be further configured to predict, based on the first state information, a time of transmission of a first control packet by the second device, generate and adjust, based on the baseband signal and the predicted time of transmission, the first and second gain signals, and provide the first and second gain signals to the first device.

In another embodiment of the present disclosure, a gain adjusting method is disclosed. The gain adjusting method can comprise receiving, by a gain adjustment circuit, a baseband signal from a first device. The baseband signal can be generated by the first device based on first and second gain signals and a power signal associated during a reception of a first data packet by the first device. The gain adjusting method can further comprise receiving, by the gain adjustment circuit, first state information from a second device. The first state information can include previous transmission information of the second device. The gain adjusting method can further comprise predicting, by the gain adjustment circuit, based on the first state information, a time of transmission of a first control packet by the second device, generating and adjusting, by the gain adjustment circuit based on the baseband signal and the predicted time of transmission, the first and second gain signals, and providing by the gain adjustment circuit, the first and second gain signals to the first device.

In yet another embodiment of the present disclosure, a communication system is disclosed. The communication system can include first and second devices and a gain adjustment circuit. The second device can be configured to generate first state information that includes previous transmission information of the second device. The first device can be configured to receive a plurality of gain signals, and generate, based on the plurality of gain signals and a power signal, a baseband signal. The power signal can be associated with a reception of a first data packet by the first device. The gain adjustment circuit can be configured to be coupled with the first and second devices, and further configured to receive the baseband signal and the first state information. The gain adjustment circuit is further configured to predict, a time of transmission of a first control packet by the second device, based on the first state information, generate and adjust, based on the baseband signal and the predicted time of transmission, the plurality of gain signals, and provide, the plurality of gain signals to the first device.

In some embodiments, the circuitry can comprise an arbiter circuit, a predictor circuit, and a peak detector. The arbiter circuit can be configured to receive the first state information, and second state information from the first device, and generate an arbiter signal based on the first state information and the second state information. The second state information can include reception information of the first data packet by the first device, and the arbiter signal can be indicative of a time of transmission of a subset of control packets by the second device and a time of reception of the first data packet by the first device. The previous transmission information includes the time of transmission of the subset of control packets. Further, the subset of control packets is transmitted by the second device before the first control packet is transmitted by the second device. The predictor circuit can be coupled with the arbiter circuit, and configured to receive the arbiter signal, determine a duty cycle of transmission of the second device based on the arbiter signal, predict the time of transmission of the first control packet based on the duty cycle of transmission, and determine whether the predicted time of transmission of the first control packet overlaps with a time period of reception of the first data packet to generate a prediction signal. The time period of reception is based on the time of reception of the first data packet. The peak detector can be configured to receive an amplified signal and the baseband signal, and determine, whether first and second signal strengths of the amplified signal and the baseband signal are greater than first and second threshold values to generate first and second peak signals, respectively. The amplified signal is an amplified version of the power signal.

In some embodiments, the circuitry can further comprise a gain controller that can be coupled with the predictor circuit and the peak detector. The gain controller can be configured to receive a first indication signal from the first device, the first and second peak signals, and the prediction signal and provide the first and second gain signals to the first device. The first indication signal can be generated based on a determination that a third signal strength of a digital version of the baseband signal is greater than a third threshold value.

In some embodiments, when the first peak signal indicates the gain controller that the first signal strength associated with the amplified signal is greater than the first threshold value, and the prediction signal indicates the gain controller that the predicted time of transmission of the first control packet non-overlaps with the time period of reception of the first data packet, the gain controller can generate the first gain signal such that the first gain signal indicates the first device to amplify the power signal by a first gain value of a first set of gain values.

In some embodiments, when the prediction signal indicates the gain controller that the predicted time of transmission of the first control packet overlaps with the time period of reception of the first data packet, the gain controller generates the first gain signal such that the first gain signal indicates the first device to amplify the power signal by a second gain value of a second set of gain values. The second set of gain values is lower than the first set of gain values, and the amplification of the power signal by the second gain value mitigates signal interference between the reception of the first data packet by the first device and a transmission of the first control packet by the second device.

In some embodiments, when the second peak signal and the first indication signal indicates the gain controller that the second signal strength associated with the baseband signal is less than the second threshold value, and the first indication signal indicates the gain controller that the third signal strength associated with the digital version of the baseband signal is less than the third threshold value, the gain controller can generate the second gain signal such that the second gain signal indicates the first device to amplify a filtered signal by a third gain value of a third set of gain values. The filtered signal can be a filtered version of the amplified signal.

In some embodiments, when the third signal strength associated with the digital version of the baseband signal is greater than the third threshold value, the gain controller can generate the second gain signal such that the second gain signal indicates the first device to amplify the filtered signal by a fourth gain value of a fourth set of gain values, and the fourth set of gain values is lower than the third set of gain values.

In some embodiments, the first device can include a receiver that can be configured to receive the first data packet and the first and second gain signals, and generate the baseband signal. The receiver comprises a low noise amplifier that can be configured to receive a first gain signal and the power signal, and amplify the power signal based on the first gain signal to generate an amplified signal. The amplified signal has a first frequency. The receiver can further include a mixer circuit that can be coupled with the low noise amplifier, and configured to receive the amplified signal, and generate a mixed signal based on the amplified signal such that the mixed signal has a second frequency. The first frequency is greater than the second frequency. The receiver can further include a filter circuit that is coupled with the mixer circuit, and configured to receive the mixed signal, and filter the mixed signal to generate a filtered signal. Further, the receiver can include a narrow band amplifier that can be coupled with the filter circuit, and configured to receive the filtered signal and a second gain signal of the first and second gain signals, and amplify the filtered signal based on the second gain signal to generate the baseband signal.

In some embodiments, the first device can further include an analog-to-digital converter (ADC) that can be coupled with the narrow band amplifier, and configured to receive the baseband signal and convert the baseband signal to generate a digital signal. The second device can further include a baseband circuit that can be coupled with the ADC, and configured to receive the digital signal, determine a first signal strength associated with the digital signal, and determine, whether the first signal strength of the digital signal is greater than a first threshold value to generate a first indication signal. Further, the baseband circuit can be configured to generate and provide second state information associated with the reception of the first data packet to the gain adjustment circuit.

Various embodiments of the present disclosure disclose first and second communication devices that are in proximity and a gain adjustment circuit that can be coupled with the first and second devices. The gain adjustment circuit can receive first and second indication signals and first and second state information generated by the first and second devices, respectively. Further, the gain adjustment circuit can predict a time of transmission of the first control packet by the second device based on the first and second state information and determines whether the time of transmission of the first control packet overlaps with a time period of reception of the first data packet by the first device to generate a prediction signal. The gain adjustment circuit can further generate a plurality of gain signals. A first gain signal can be generated based on the prediction signal and the first indication signal, and a second gain signal can be generated based on the second indication signal. The first and second gain signals are provided to the first device.

The gain adjustment circuit is thus configured to adjust the gain values associated with the first and second gain signals to avoid saturation of a low noise amplifier and a narrow band amplifier in a receiver of the first device. Further, the gain adjustment circuit receives the prediction signal that indicates whether the time of transmission of the first control packet overlaps with the time period of reception of the first data packet, and generates a lower gain value associated with the first gain signal if the overlap is predicted to occur. Therefore, the interference between the reception of the first data packet by the first device and the transmission of the first control packet by the second device is mitigated. In addition, the corruption of the first data packet is mitigated.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
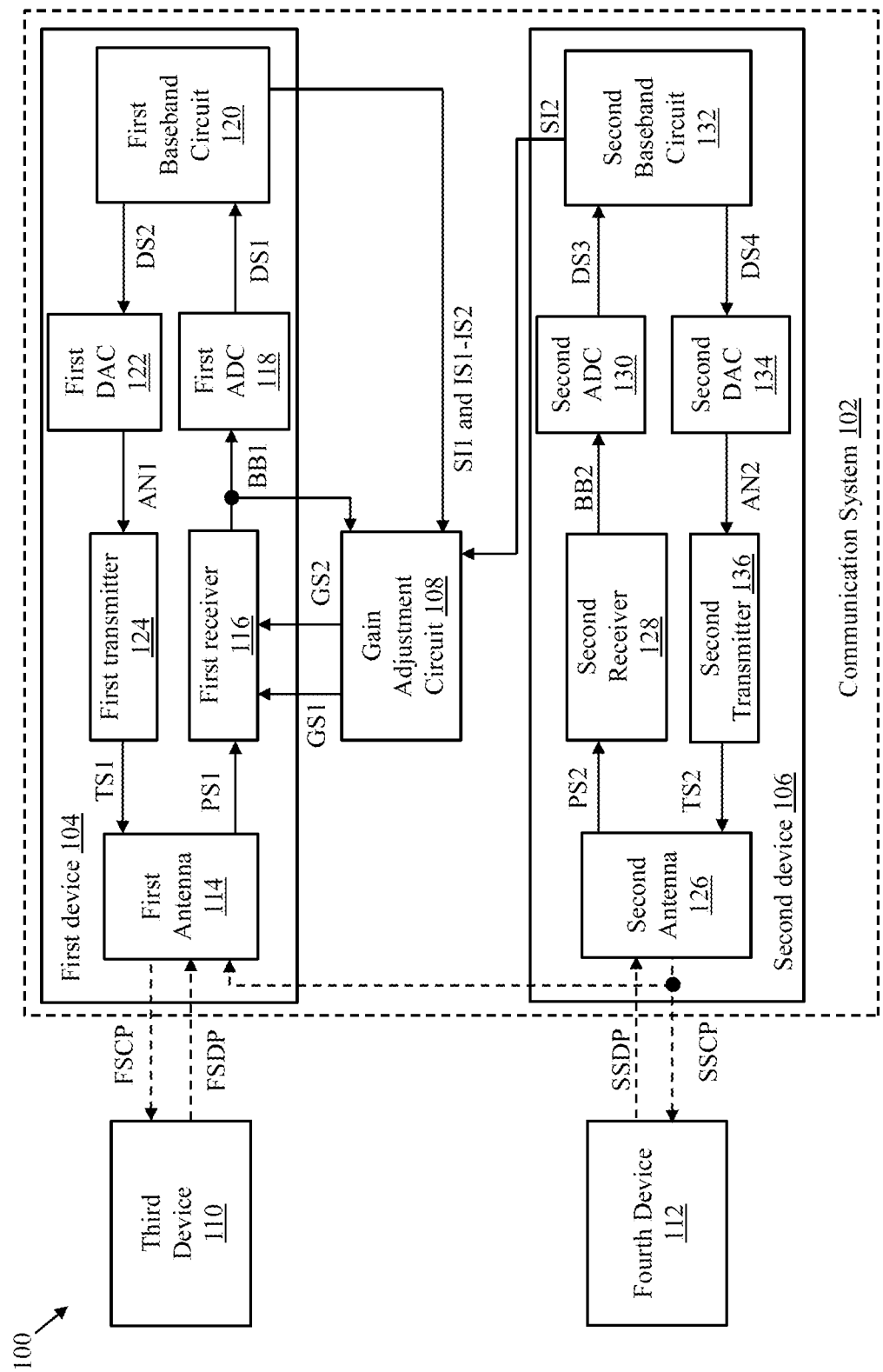
FIG. 1 illustrates a schematic block diagram of a communication system in accordance with an embodiment of the present disclosure.

FIG. 1 illustrates a schematic block diagram of a communication network 100 in accordance with an embodiment of the present disclosure. The communication network 100 may be a wired or wireless network. Examples of the communication network 100 include a computer network, a cellular network, a network-on-chip, a network-on-multi-chip, and the like. The communication network 100 can include a communication system 102. The communication system 102 can include first and second devices 104 and 106 and a gain adjustment circuit 108. The first and second devices 104 and 106 are coupled with the gain adjustment circuit 108. The communication network 100 can further include third and fourth devices 110 and 112. It will be apparent to a person skilled in the art that though in the current embodiment the third and fourth devices 110 and 112 are shown external to the communication system 102, in various other embodiments the third and fourth devices 110 and 112 may be a part of the communication system 102.

The first through fourth devices 104, 106, 110, and 112 may be any wired or wireless communication devices that are configured to perform at least one of transmission of control packets or reception of data packets. For example, when the communication network 100 is a computer network or a cellular network, the first device 104 may be a wireless communication device such as a Bluetooth (BT) device, a wireless local area network (WLAN) device, or the like. Further, the second device 106 may be any one of a wired device and a wireless device. Examples of the second device 106 include a local-area-network (LAN) device, high-definition media interface (HDMI), a WLAN device, a BT device, and the like. The first device 104 can be coupled with the third device 110. When the communication network 100 is a network-on-chip, the first and second devices 104 and 106 and the gain adjustment circuit 108 are on a single System-On-Chip (SoC). It will be understood by those skilled in the art that when the communication network 100 is a network-on-multi-chip, the first and second devices 104 and 106 and the gain adjustment circuit 108 are on different SoCs. Further, when the communication system 102 is a network-on-chip or a network-on-multi-chip, the first and second devices 104 and 106 may accordingly be any hardware devices on the same SoC or multiple SoCs.

The first device 104 can be configured to at least one of receive a first set of data packets FSDP from the third device 110, and generate and transmit a first set of control packets FSCP to the third device 110. The second device 106 can be coupled with the fourth device 112. The second device 106 can be configured to at least one of receive a second set of data packets SSDP from the fourth device 112, and generate and transmit a second set of control packets SSCP to the fourth device 112. In an embodiment, the first and second sets of control packets FSCP and SSCP are transmitted to the third and fourth devices 110 and 112, as an acknowledgment to the reception of the first and second sets of data packets FSDP and SSDP by the first and second devices 104 and 106, respectively.

For the sake of ongoing discussion, it is assumed that the first device 104 is a BT device (i.e., a low data rate communication device) and the second device 106 is a WLAN device (i.e., a high data rate communication device). It will be apparent to a person skilled in the art that the scope of the present disclosure is not limited to the first and second devices 104 and 106 being BT and WLAN devices. In various other embodiments, any other communication devices that operate in accordance with the working of the present disclosure may be included in the communication system 102, without deviating from the scope of the present disclosure. It is further assumed that the first device 104 can be configured to receive a first data packet of the first set of data packets FSDP, and the second device 106 can be configured to transmit a first control packet of the second set of control packets SSCP. In a scenario, if the first data packet is being received and the first control packet is being transmitted in the same time interval, signal interference occurs between the reception of the first data packet and the transmission of the first control packet. The signal interference causes the first data packet to be corrupted. It will further be apparent to a person skilled in the art that the scope of the present disclosure is not limited to the signal interference between two communication devices, i.e., the first and second devices 104 and 106, but may include the signal interference occurring between any number of communication devices that are in proximity with each other and the first and second devices 104 and 106.

The first device 104 can be further configured to generate and provide first state information SI1 to the gain adjustment circuit 108. The first state information SI1 can include at least one of reception information that is associated with the reception of the first set of data packets FSDP or transmission information that is associated with the transmission of the first set of control packets FSCP. The first state information SI1 thus indicates the state information of the first device 104 (i.e., whether the first device 104 is at least one of transmitting the first set of control packets FSCP or receiving the first set of data packets FSDP). For the sake of simplicity of the ongoing discussion and without deviating from the scope of the disclosure, the ongoing explanation has been discussed in terms of the reception of a single data packet, i.e., the first data packet, by the first device 104, and the transmission of a single control packet, i.e., the first control packet, by the second device 106. Thus, the first state information SI1 can include reception information of the first data packet by the first device 104. In an example, the reception information of the first data packet includes a time of reception of the first data packet. The first device 104 can be further configured to receive a plurality of gain signals from the gain adjustment circuit 108. The plurality of gain signals may include first and second gain signals GS1 and GS2. The first device 104 may include a first antenna 114, a first receiver 116, a first analog-to-digital converter (ADC) 118, a first baseband circuit 120, a first digital-to-analog converter (DAC) 122, and a first transmitter 124.

The first antenna 114 may be coupled with the third device 110, and configured to receive the first set of data packets FSDP, i.e., the first data packet. On the reception of the first data packet, the first antenna 114 can be configured to output a first power signal PS1 that is associated with the reception of the first data packet. In a scenario, the first antenna 114 can be further configured to receive the first control packet when the second device 106 transmits the first control packet. The reception of the first control packet by the first antenna 114 may occur due to the signal interference arising from a proximity of the first and second devices 104 and 106. Thus, the first power signal PS1 corresponds to a power associated with the reception of the first data packet and the first control packet by the first antenna 114.

The first antenna 114 can be further configured to receive a first transmitter signal TS1. On reception of the first transmitter signal TS1, the first antenna 114 can be further configured to output and transmit the first set of control packets FSCP to the third device 110.

The first receiver 116 may include suitable circuitry that may be configured to perform one or more operations. The first receiver 116 may be coupled with the first antenna 114, and configured to receive the first power signal PS1. The first receiver 116 may be further coupled with the gain adjustment circuit 108, and configured to receive the first and second gain signals GS1 and GS2. Based on the first power signal PS1 and the first and second gain signals GS1 and GS2, the first receiver 116 can be configured to generate a first baseband signal BB1 such that a signal-to-noise ratio of the first baseband signal BB1 is greater than a signal-to-noise ratio of the first power signal PS1. The structure and working of the first receiver 116 are explained in detail in FIG. 2.

The first ADC 118 may include suitable circuitry that may be configured to perform one or more operations. The first ADC 118 may be coupled with the first receiver 116, and configured to receive the first baseband signal BB1 which is in analog format. The first ADC 118 can be further configured to perform analog-to-digital conversion to convert the first baseband signal BB1 and generate a digital version of the first baseband signal BB1, i.e., the first digital signal DS1.

The first baseband circuit 120 may include suitable circuitry that may be configured to perform one or more operations. The first baseband circuit 120 may be coupled with the first ADC 118 and the gain adjustment circuit 108. The first baseband circuit 120 is configured to receive the first digital signal DS1, and determine a first signal strength of the first power signal PS1 (i.e., the first signal strength associated with the reception of the first data packet) based on the first digital signal DS1 and the first and second gain signals GS1 and GS2 that are associated with the first digital signal DS1. The first baseband circuit 120 is further configured to generate and provide the first state information SI1, and first and second indication signals IS1 and IS2 to the gain adjustment circuit 108. The first baseband circuit 120 can be further configured to generate the first state information SI1 based on reception and transmission requests generated by the first device 104. The reception and transmission requests are generated to access a shared resource (i.e., the first antenna 114). For instance, when the first device 104 and a fifth device (not shown) are configured to access the shared resource (i.e., the first antenna 114), the first baseband circuit 120 of the first device 104 and a third baseband circuit (not shown) of the fifth device are configured to generate and provide requests to the gain adjustment circuit 108. The gain adjustment circuit 108, based on pre-defined priorities of the first and fifth devices 104 is configured to grant permission to one of the first and fifth devices 104, to access the shared resource (i.e., first antenna 114). In a present embodiment, the first device 104 includes the first antenna 114, therefore, the first device 104 has higher priority compared to the fifth device.

When the first device 104 is accessing the first antenna 114 for receiving the first set of data packets FSDP, the first baseband circuit 120 can be configured to generate corresponding first state information SI1. When the first device 104 is accessing the first antenna 114 for transmitting the first set of control packets FSCP, the first baseband circuit 120 can be configured to generate another corresponding first state information SI1. The first baseband circuit 120 can be further configured to generate the first indication signal IS1 based on the first power signal PS1, and the second indication signal IS2 based on the first digital signal DS1 as explained herein.

The first baseband circuit 120 can be further configured to determine whether the first signal strength is greater than a first threshold value. Based on the determination, the first baseband circuit 120 can be further configured to generate the first indication signal IS1. The first threshold value is an undershoot value of the first signal strength that is defined by the gain adjustment circuit 108. When the first signal strength is greater than the first threshold value, the first baseband circuit 120 can be configured to generate an activated first indication signal IS1 (i.e., the first indication signal IS1 is generated at a logic high state). When the first signal strength is less than the first threshold value, the first baseband circuit 120 can be configured to generate a deactivated first indication signal IS1 (i.e., first indication signal IS1 is generated at logic low state).

On reception of the first digital signal DS1, the first baseband circuit 120 can be configured to determine a second signal strength associated with the reception of the first digital signal DS1. The first baseband circuit 120 can be further configured to determine whether the second signal strength is greater than a second threshold value. Based on the determination, the first baseband circuit 120 can be configured to generate the second indication signal IS2. The second threshold value is an overshoot value of the second signal strength that is defined by the gain adjustment circuit 108. In the presently preferred embodiment, the second signal strength is required to be less than the second threshold value. When the second signal strength is greater than the second threshold value, the second indication signal IS2 is activated (i.e., the second indication signal IS2 is generated at a logic high state). The second indication signal IS2 is deactivated (i.e., the second indication signal IS2 is generated at a logic low state) when the second signal strength is less than the second threshold value. The first baseband circuit 120 can be further configured to generate a second control packet of the first set of control packets FSCP by way of a second digital signal DS2, based on the reception of the first data packet by way of the first digital signal DS1. When the first baseband circuit 120 generates the second digital signal DS2, the first device 104 can be configured to generate and transmit the second control packet, to the third device 110. In an embodiment, the second control packet is transmitted to the third device 110 as an acknowledgment of the reception of the first data packet by the first device 104.

The first DAC 122 may include suitable circuitry that may be configured to perform one or more operations. The first DAC 122 may be coupled with the first baseband circuit 120, and configured to receive the second digital signal DS2. The second digital signal DS2 is in digital format. The first DAC 122 may be further configured to perform digital-to-analog conversion to convert the second digital signal DS2 and generate a first analog signal AN1.

The first transmitter 124 may include suitable circuitry that may be configured to perform one or more operations. The first transmitter 124 may be coupled with the first DAC 122, and configured to receive the first analog signal AN1 and generate a first transmitter signal TS1. The first transmitter 124 may be further coupled with the first antenna 114, and configured to provide the first transmitter signal TS1 to the first antenna 114.

The second device 106 can be configured to receive the second set of data packets SSDP from the fourth device 112 and transmit the second set of control packets SSCP to the fourth device 112. The second device 106 further may be coupled with the gain adjustment circuit 108, and configured to generate and provide second state information SI2 to the gain adjustment circuit 108. The second state information SI2 can be associated with at least one of the transmission of a subset of control packets from the second set of control packets SSCP and the reception of the second set of data packets SSDP. Since in the presently preferred embodiment, it is assumed that the second device 106 transmits the first control packet, the second state information SI2 thus includes transmission information of the subset of control packets. The subset of control packets excludes the first control packet. The subset of control packets includes control packets from the second set of control packets SSCP that are transmitted before the first control packet is transmitted. The second state information SI2 thus includes previous transmission information of the second device 106, i.e., information associated with the transmission of the subset of control packets before transmitting the first control packet. The information associated with the transmission of the subset of control packets may include a transmission time of each control packet of the subset of control packets. The second device 106 may include a second antenna 126, a second receiver 128, a second ADC 130, a second baseband circuit 132, a second DAC 134, and a second transmitter 136.

The second antenna 126 may be coupled with the fourth device 112. The second antenna 126 can be configured to receive a second transmitter signal TS2, and generate and transmit the first control packet of the second set of control packets SSCP to the fourth device 112. In another scenario, the second antenna 126 can be further configured to receive the second set of data packets SSDP. On receiving a second data packet of the second set of data packets SSDP, the second antenna 126 can be further configured to output a second power signal PS2 that corresponds to a power associated with the reception of the second data packet.

The second receiver 128 may include suitable circuitry that may be configured to perform one or more operations. The second receiver 128 may be coupled with the second antenna 126. The second receiver 128 can be configured to receive the second power signal PS2. Based on the received second power signal PS2, the second receiver 128 can be further configured to generate a second baseband signal BB2 such that a signal-to-noise ratio of the second baseband signal BB2 is greater than a signal-to-noise ratio of the second power signal PS2.

The second ADC 130 may include suitable circuitry that may be configured to perform one or more operations. The second ADC 130 may be coupled with the second receiver 128. The second ADC 130 can be configured to receive the second baseband signal BB2 which is in analog format. The second ADC 130 can be further configured to perform analog-to-digital conversion to convert the second baseband signal BB2 and generate a third digital signal DS3.

The second baseband circuit 132 may include suitable circuitry that may be configured to perform one or more operations. The second baseband circuit 132 may be coupled with the second ADC 130, and configured to receive the third digital signal DS3. The second baseband circuit 132 may further be coupled with the gain adjustment circuit 108, and configured to generate and provide the second state information SI2 to the gain adjustment circuit 108. In a scenario, when the second device 106 is accessing the second antenna 126 for receiving the second set of data packets SSDP, the second baseband circuit 132 can be configured to generate corresponding second state information SI2. When the second device 106 is accessing the second antenna 126 for transmitting the second set of control packets SSCP, the second baseband circuit 132 can be configured to generate corresponding second state information SI2. Further, when the second device 106 receives the second data packet, the second baseband circuit 132 may generate and provide a plurality of indication signals (not shown) to the gain adjustment circuit 108. The generation of the plurality of indication signals is similar to the generation of the first and second indication signals IS1 and IS2. The second baseband circuit 132 can be further configured to generate the first control packet by way of a fourth digital signal DS4, based on the reception of the second data packet of the second set of data packets SSDP by way of the third digital signal DS3. When the second baseband circuit 132 generates the fourth digital signal DS4, as a response to the third digital signal DS3, the second device 106 can be configured to generate and transmit the first control packet, to the fourth device 112. In an embodiment, the first control packet is transmitted to the fourth device 112 as an acknowledgment to the reception of the second data packet of the second set of data packets SSDP.

The second DAC 134 may include suitable circuitry that may be configured to perform one or more operations. The second DAC 134 may be coupled with the second baseband circuit 132. The second DAC 134 can be configured to receive the fourth digital signal DS4. The fourth digital signal DS4 is in digital format. The second DAC 134 can be further configured to perform digital-to-analog conversion to convert the fourth digital signal DS4 and generate a second analog signal AN2.

The second transmitter 136 may include suitable circuitry that may be configured to perform one or more operations. The second transmitter 136 may be coupled with the second antenna 126 and the second DAC 134. The second transmitter 136 can be configured to receive the second analog signal AN2, and output and transmit the second transmitter signal TS2 to the second antenna 126. The second transmitter signal TS2 can correspond to the power associated with the transmission of the first control packet. The second antenna 126 can be further configured to receive the second transmitter signal TS2, and output and transmit the first control packet to the fourth device 112.

In the presently preferred embodiment, it is assumed that the first device 104 receives the first data packet and the second device 106 transmits the first control packet. However, it will be apparent to a person skilled in the art that the scope of the present disclosure is not limited to the first and second devices 104 and 106 receiving and transmitting the first data packet and the first control packet, respectively. In various other embodiments, the first and second devices 104 and 106 can be configured to transmit and receive a second control packet from the first set of control packets FSCP and a second data packet from the second set of data packets SSDP, respectively, without deviating from the scope of the present disclosure.

The gain adjustment circuit 108 is coupled with the first device 104 (i.e., the first receiver 116 and the first baseband circuit 120) and the second device 106 (i.e., the second baseband circuit 132). The gain adjustment circuit 108 includes suitable circuitry that can be configured to perform one or more operations as stated herein. The circuitry of the gain adjustment circuit 108 can be configured to receive the first and second state information SI1 and SI2 from the first and second baseband circuits 120 and 132, respectively. The circuitry of the gain adjustment circuit 108 can be further configured to receive the first baseband signal BB1 (i.e., from the first receiver 116) from the first device 104 and the first and second indication signals IS1 and IS2 from the first device 104 (i.e., from the first baseband circuit 120). The circuitry of the gain adjustment circuit 108 can be further configured to generate and provide the first and second gain signals GS1 and GS2 to the first device 104, i.e., the first receiver 116. A plurality of gain values is associated with the first and second gain signals GS1 and GS2. Further, a gain value from the plurality of gain values is selected based on the first and second indication signals IS1 and IS2 and the first and second state information SI1 and SI2. The gain adjustment circuit 108 has been explained in detail in FIG. 2.

In the presently preferred embodiment, a size of the data packet is greater than a size of the control packet. Therefore, when signal interference occurs between the reception of the first data packet and the transmission of the first control packet, the signal interference causes the first data packet to be corrupted. The gain adjustment circuit 108 can be configured to adjust the gain values of the first and second gain signals GS1 and GS2 to mitigate the interference, increase the signal-to-noise ratio of the first baseband signal BB1 with respect to the first power signal PS1, and mitigate the corruption of the first data packet.

Figure 2:
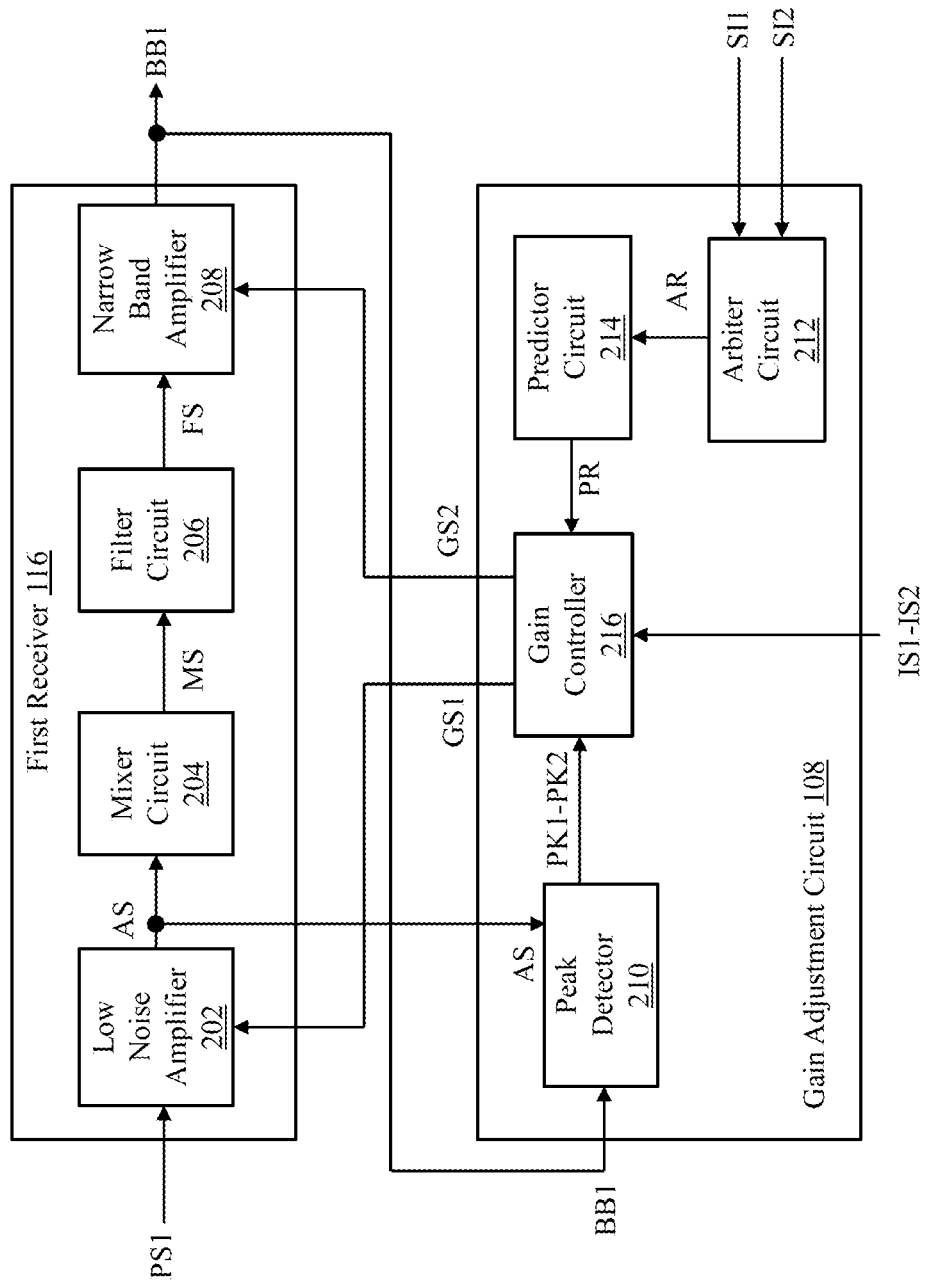
FIG. 2 illustrates a schematic block diagram of a first receiver of a first device and a gain adjustment circuit of the communication system of FIG. 1, in accordance with an embodiment of the present disclosure.
Figure 3A:
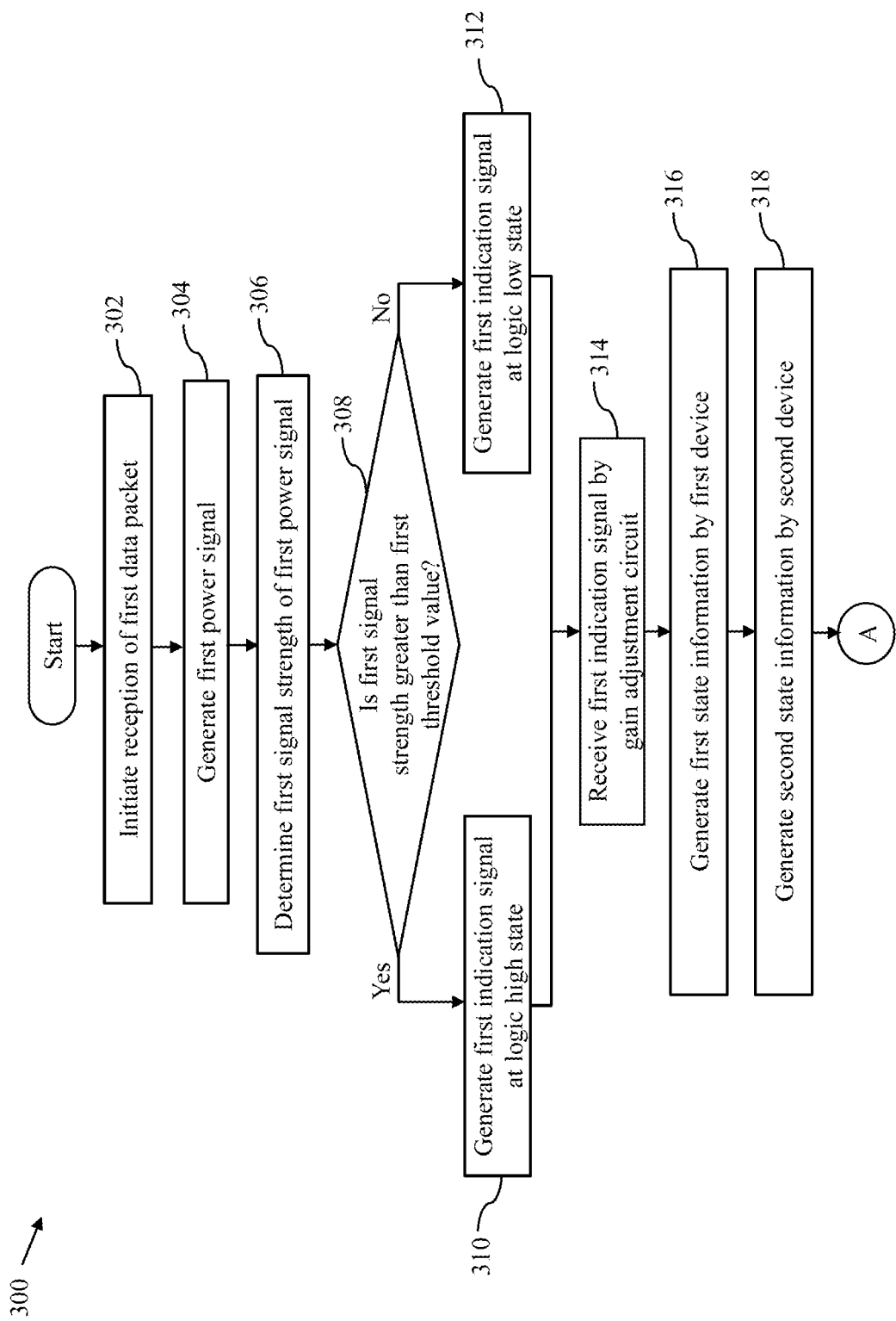
FIGS. 3A-3F collectively, represent a flow chart that illustrates a gain adjusting method implemented by the communication system of FIG. 1 in accordance with an embodiment of the present disclosure.
Figure 3B:
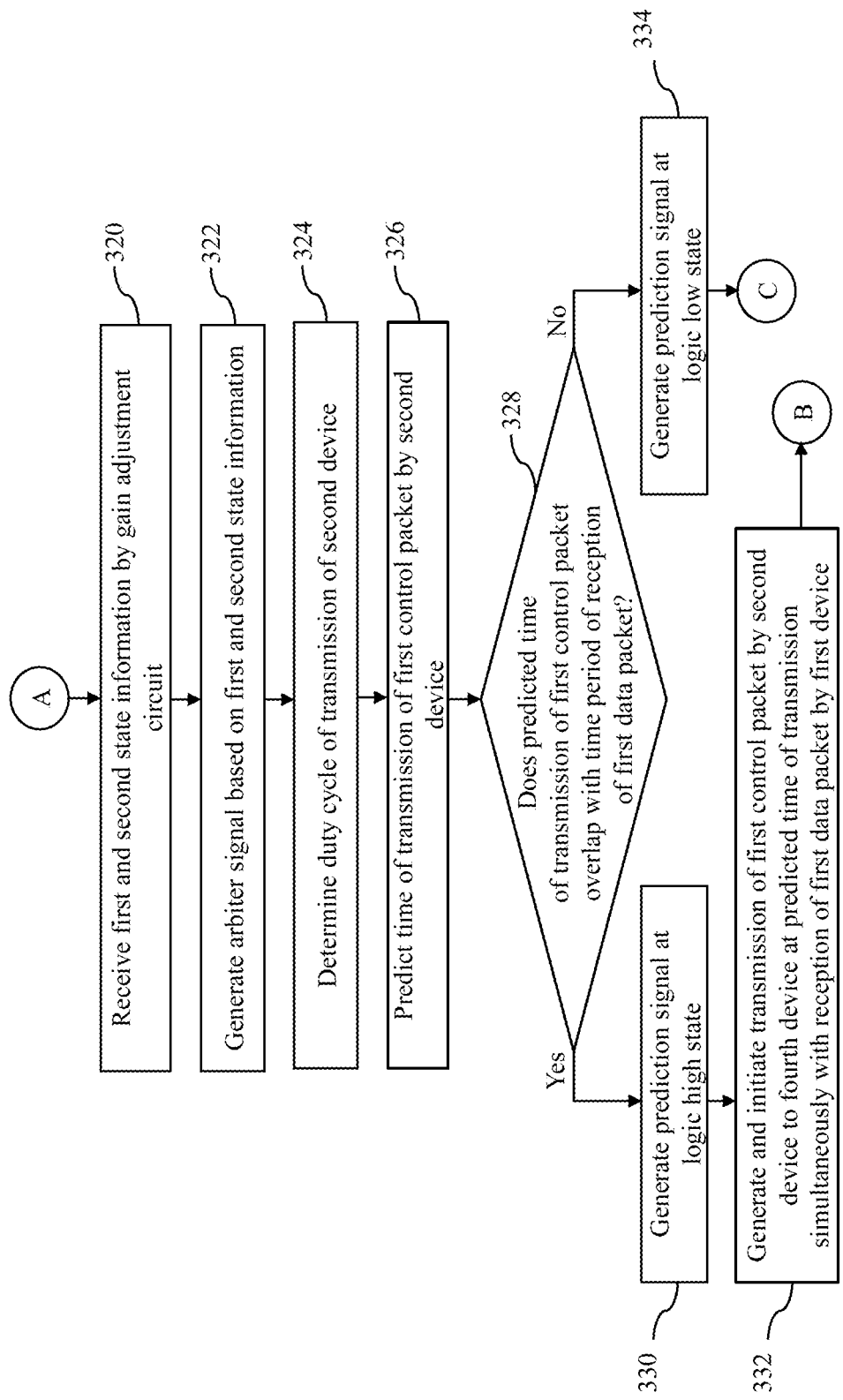
Figure 3C:
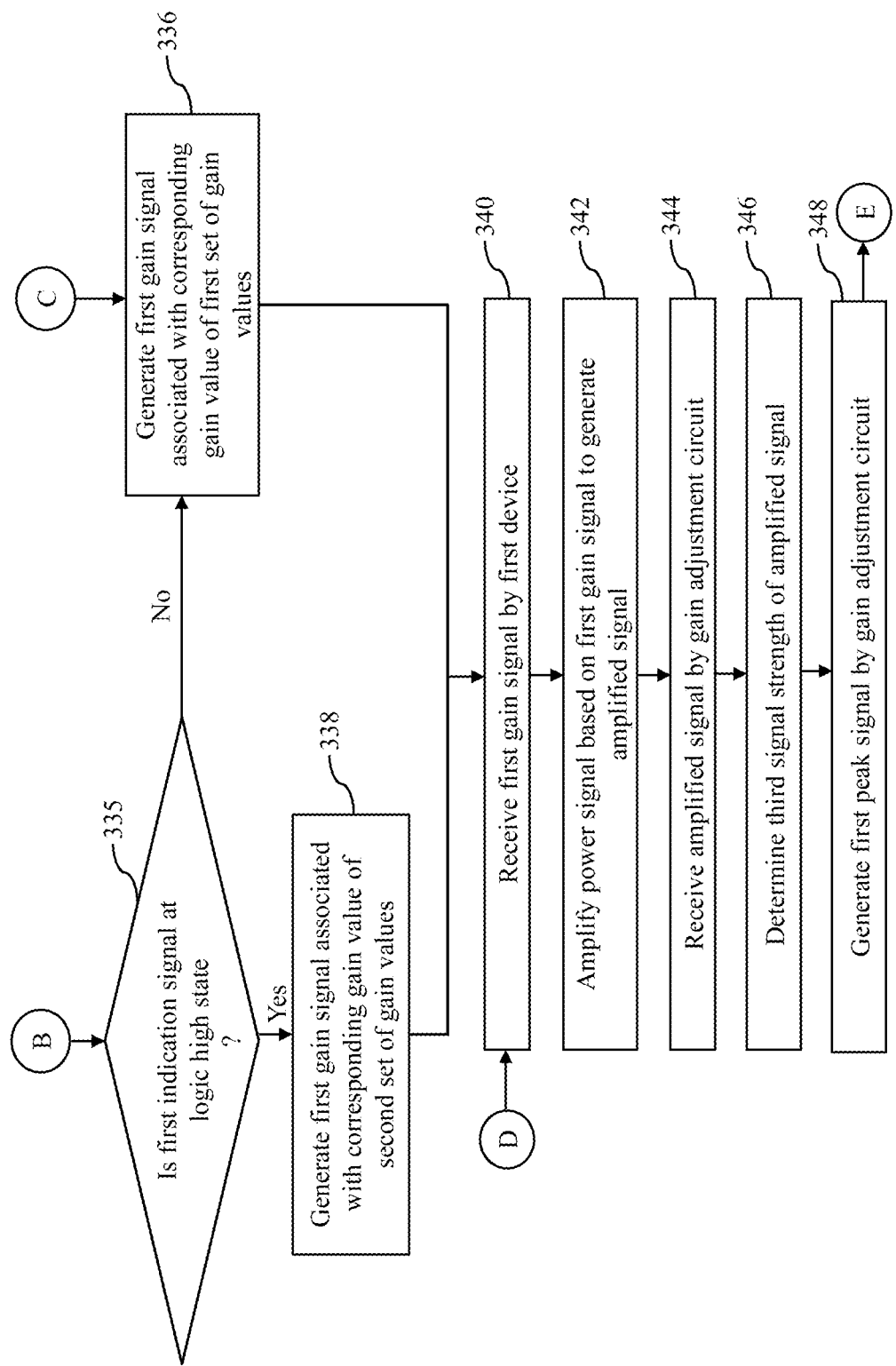
Figure 3D:
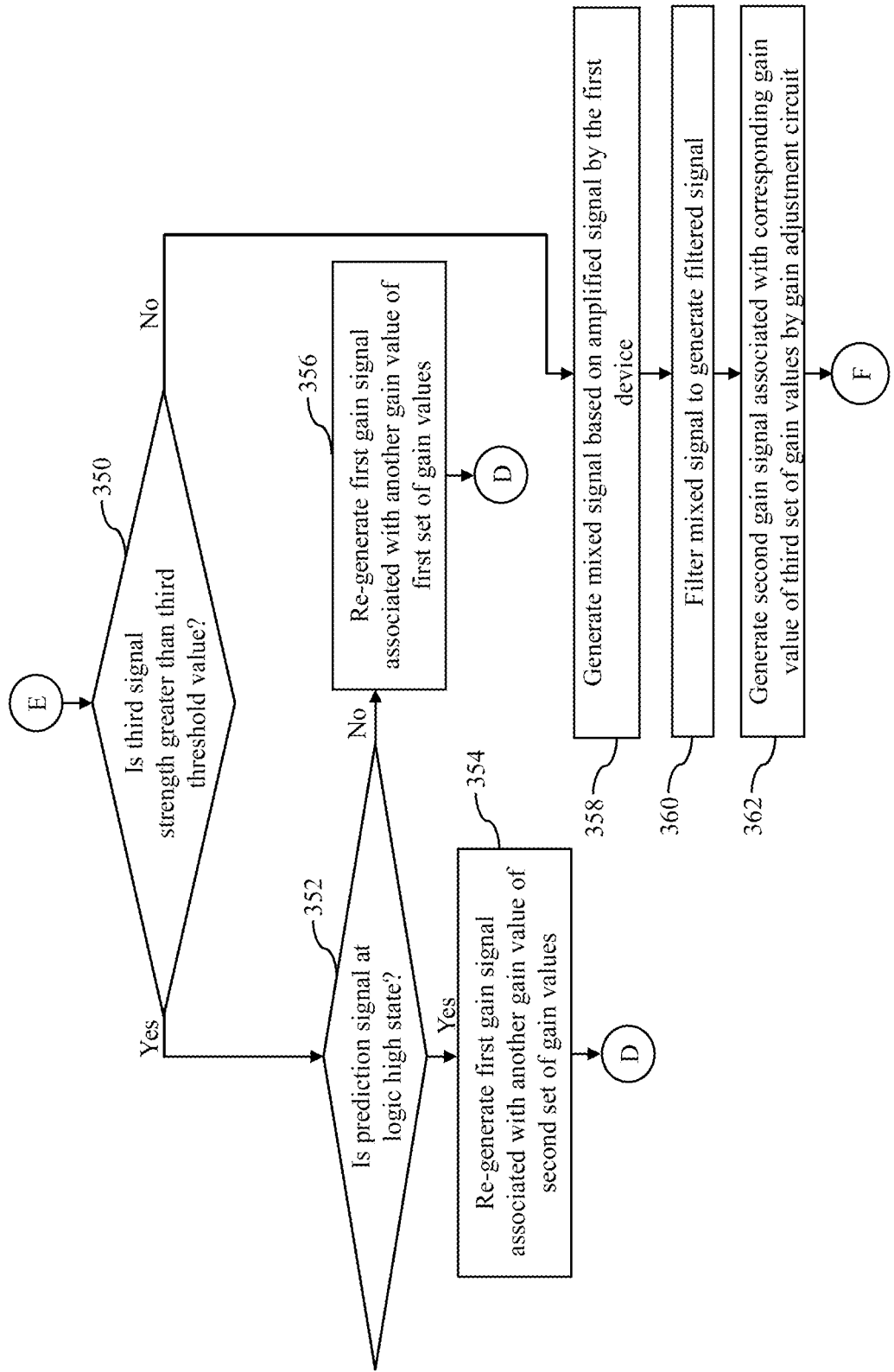
Figure 3E:
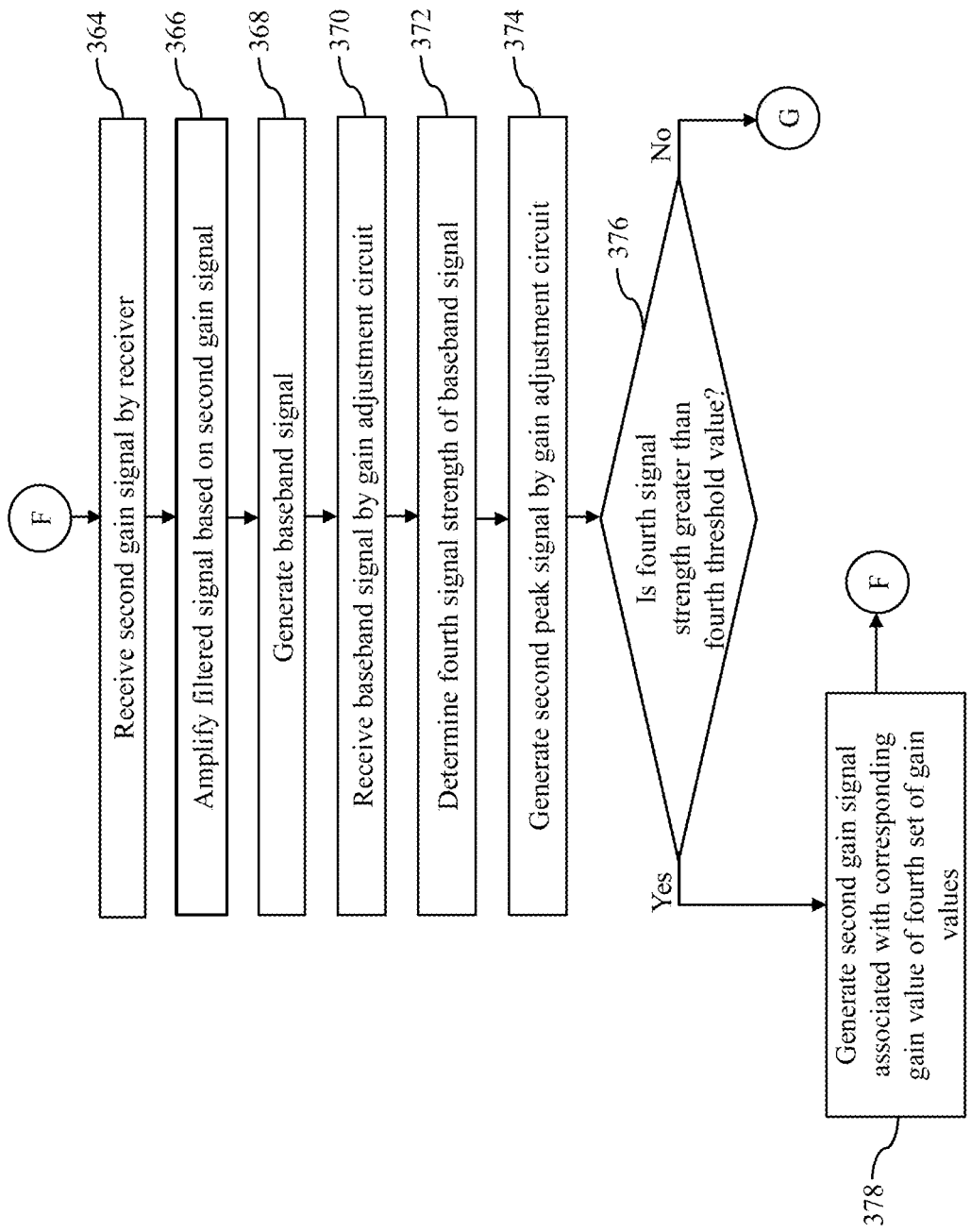
Figure 3F:
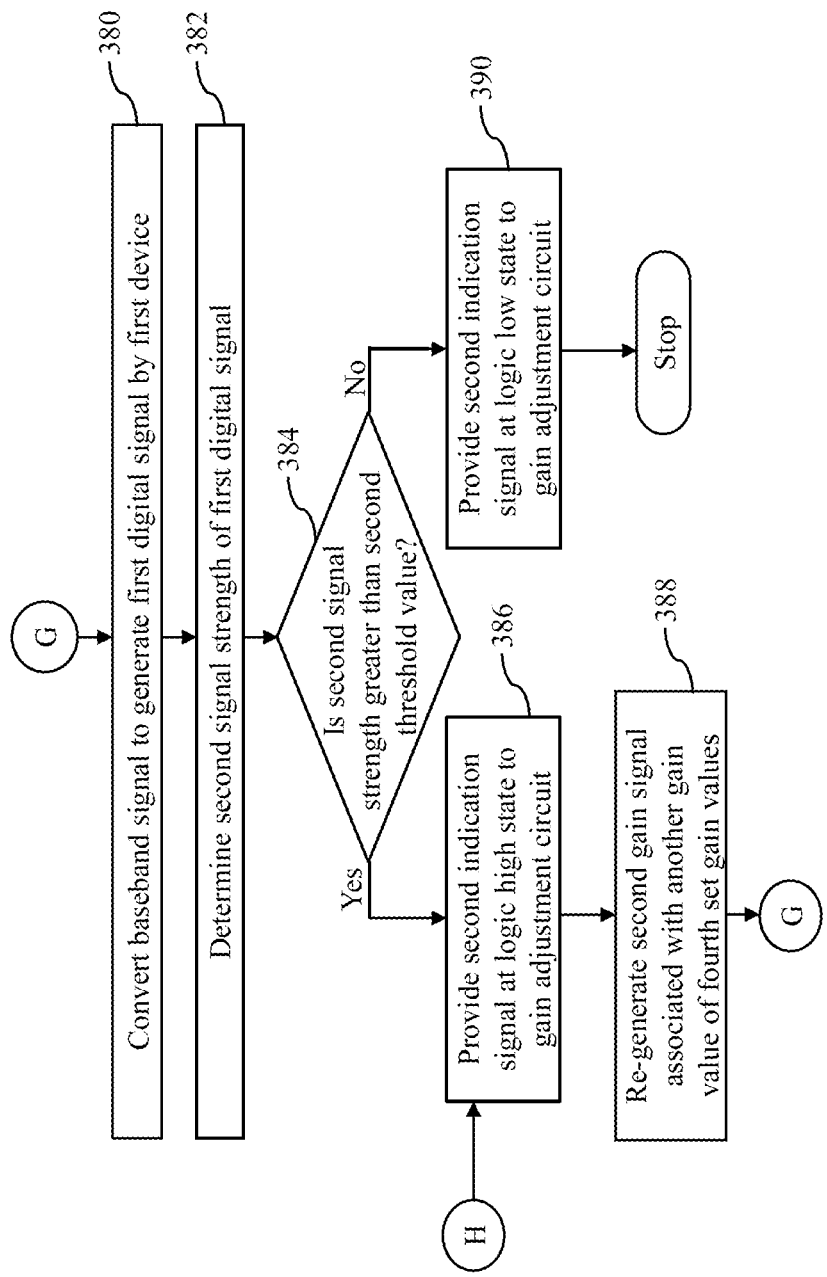

FIG. 2 illustrates a schematic block diagram of the gain adjustment circuit 108 and the first receiver 116 of the communication system 102, in accordance with an embodiment of the present disclosure. The first receiver 116 may include a low noise amplifier (LNA) 202, a mixer circuit 204, a filter circuit 206, and a narrow band amplifier 208. The gain adjustment circuit 108 may include a peak detector 210, an arbiter circuit 212, a predictor circuit 214, and a gain controller 216.

The LNA 202 may include suitable circuitry that may be configured to perform one or more operations. The LNA 202 is designed such that it operates at a high frequency. In an example, the LNA 202 operates at a frequency of 2.4 Gigahertz (GHz). The LNA 202 may be coupled with the first antenna 114, and configured to receive the first power signal PS1. The LNA 202 may be further coupled with the gain adjustment circuit 108, and configured to receive the first gain signal GS1. The LNA 202 can be configured to amplify the first power signal PS1 based on the first gain signal GS1 to generate an amplified signal AS at a first frequency. The amplified signal AS is thus an amplified version of the first power signal PS1. The amplified signal AS is generated such that a saturation of the LNA 202 is avoided.

The mixer circuit 204 may include suitable circuitry that may be configured to perform one or more operations. The mixer circuit 204 may be coupled with the LNA 202, and configured to receive the amplified signal AS at the first frequency. The mixer circuit 204 can be configured to down convert the first frequency of the amplified signal AS to a desired frequency and generate a mixed signal MS at a second frequency such that the second frequency is lower than the first frequency.

The filter circuit 206 may include suitable circuitry that may be configured to perform one or more operations. The filter circuit 206 may be coupled with the mixer circuit 204. The filter circuit 206 can be configured to receive the mixed signal MS, and filter the mixed signal MS to generate a filtered signal FS, i.e., a filtered version of the amplified signal AS. In a scenario, when interference occurs, along with the reception of the first data packet by the first device 104, the first control packet is received by the first device 104 when the first control packet is transmitted by the second device 106. Thus, the filter circuit 206 can be configured to attenuate the power associated with the reception of the first control packet by the first device 104, and generate a filtered signal FS. In the presently preferred embodiment, the filter circuit 206 is a low pass filter and filters out high frequencies from the mixed signal MS.

The narrow band amplifier 208 may include suitable circuitry that may be configured to perform one or more operations. The narrow band amplifier 208 may be coupled with the filter circuit 206, and configured to receive the filtered signal FS. The narrow band amplifier 208 further may be coupled with the gain adjustment circuit 108, and configured to receive the second gain signal GS2. Based on the second gain signal GS2, the narrow band amplifier 208 can be configured to amplify a band of frequencies associated with the filtered signal FS, and generate the first baseband signal BB1 such that the signal-to-noise ratio of the first baseband signal BB1 is greater than the signal-to-noise ratio of the first power signal PS1. The narrow band amplifier 208 amplifies the filtered signal FS.

The peak detector 210 may include suitable circuitry that may be configured to perform one or more operations. The peak detector 210 may be coupled with the first receiver 116 (i.e., the LNA 202 and the narrow band amplifier 208). The peak detector 210 is configured to receive the amplified signal AS and the first baseband signal BB1, sequentially, and determine peak values of the amplified signal AS and the first baseband signal BB1 that indicate third and fourth signal strengths associated with the amplified signal AS and the first baseband signal BB1, respectively. Further, based on the third and fourth signal strengths, the peak detector 210 can be configured to generate first and second peak signals PK1 and PK2, sequentially. The first and second peak signals PK1 and PK2 are generated such that the first and second peak signals PK1 and PK2 indicate whether the third and fourth signal strengths are greater than third and fourth threshold values, respectively. The third and fourth threshold values are overshoot values of the third and fourth signal strengths above which the LNA 202 and the narrow band amplifier 208 may saturate, respectively. Therefore, the third and fourth signal strengths are required to be less than the third and fourth threshold values, respectively.

When the third signal strength is greater than the third threshold value, the peak detector 210 generates an activated first peak signal PK1 (i.e., the first peak signal PK1 is generated at logic high state) and when the third signal strength is less than the third threshold value, the peak detector 210 generates a deactivated first peak signal PK1 (i.e., the first peak signal PK1 is generated at logic low state). Further, when the fourth signal strength is greater than the fourth threshold value, the peak detector 210 generates an activated second peak signal PK2 (i.e., the second peak signal PK2 is generated at logic high state) and when the fourth signal strength is less than the fourth threshold value, the peak detector 210 generates a deactivated second peak signal PK2 (i.e., the second peak signal PK2 is generated at logic low state).

The arbiter circuit 212 may include suitable circuitry that may be configured to perform one or more operations. The arbiter circuit 212 may be coupled with the first and second baseband circuits 120 and 132, and configured to receive the first and second state information SI1 and SI2. Based on the first state information SI1 and second state information SI2, the arbiter circuit 212 can be configured to generate an arbiter signal AR. The arbiter signal AR is indicative of a time of transmission of the subset of control packets from the second set of control packets SSCP and a time of reception of the first set of data packets FSDP (i.e., the first data packet).

The predictor circuit 214 may include suitable circuitry that may be configured to perform one or more operations. The predictor circuit 214 may be coupled with the arbiter circuit 212, and configured to receive the arbiter signal AR. The predictor circuit 214 is configured to determine a duty cycle of transmission of the second device 106 and predict a time of transmission of the first control packet based on the duty cycle of transmission. In one example, the duty cycle of transmission of the second device 106 corresponds to a transmission interval between each control packet of the subset of control packets. In one embodiment, the predictor circuit 214 is further configured to determine a duration of reception of the first data packet based on the arbiter signal AR. Thus, the duration of reception is based on the time of reception of the first data packet. The predictor circuit 214 is further configured to determine whether the predicted time of transmission of the first control packet overlaps with the duration of reception of the first data packet. Further, the predictor circuit 214 is configured to generate and provide the prediction signal PR to the gain controller 216.

When the predictor circuit 214 determines that a time of transmission of the first control packet non-overlaps with the duration of reception of the first data packet, the predictor circuit 214 generates a deactivated prediction signal PR (i.e., the prediction signal PR is generated at logic low state). When the predictor circuit 214 determines that the time of transmission of the first control packet overlaps with the duration of reception of the first data packet, the predictor circuit 214 generates an activated prediction signal PR (i.e., the prediction signal PR is generated at logic high state). The predictor circuit 214 can be further configured to provide the prediction signal PR to the gain controller 216. It will be apparent to a person skilled in the art that when the first and second devices 104 and 106 are transmitting and receiving the second control packet and the second data packet, respectively, the predictor circuit 214 is further configured to determine whether a predicted time period of reception of the second data packet by the second device 106 overlaps with a time of transmission of the second control packet by the first device 104.

The gain controller 216 may include suitable circuitry that may be configured to perform one or more operations. The gain controller 216 may be coupled with the peak detector 210, and configured to receive the first and second peak signals PK1-PK2, sequentially. The gain controller 216 can be coupled with the first baseband circuit 120, and configured to receive the first and second indication signals IS1 and IS2, sequentially. The gain controller 216 can be further coupled with the predictor circuit 214, and configured to receive the prediction signal PR. Further, the gain controller 216 can be configured to generate the first gain signal GS1 based on the first indication signal IS1, the first peak signal PK1, and the prediction signal PR. The gain controller 216 can be further configured to generate the second gain signal GS2 based on the second indication signal IS2 and the second peak signal PK2. The gain controller 216 can be coupled with the LNA 202 and the narrow band amplifier 208, and configured to provide the first and second gain signals GS1 and GS2 to the LNA 202 and the narrow band amplifier 208, respectively.

When the gain controller 216 receives the deactivated first indication signal IS1, the gain controller 216 generates the first gain signal GS1 corresponding to a first gain value of a first set of gain values. Each gain value in the first set of gain values is arranged in a decreasing order such that the first gain value is greater than a second gain value of the first set of gain values. When the first gain signal GS1 is generated such that the first gain signal GS1 corresponds to the first gain value, the gain controller 216 indicates the LNA 202 to amplify the first power signal PS1 by the first gain value.

When the gain controller 216 receives the activated first indication signal IS1, and the deactivated prediction signal PR, the gain controller 216 generates the first gain signal GS1 corresponding to another gain value of the first set of gain values. For example, the gain controller 216 may generate the first gain signal GS1 at the second gain value to mitigate the interference. The interference is mitigated by amplifying the power associated with the first data packet and attenuating the power associated with the first control packet. Thus, the corruption of the first data packet is mitigated. When the first gain signal GS1 is generated such that the first gain signal GS1 corresponds to the second gain value, the gain controller 216 indicates the LNA 202 to amplify the first power signal PS1 by the second gain value.

When the gain controller 216 is configured to receive the activated first indication signal IS1 and the activated prediction signal PR, the gain controller 216 generates the first gain signal GS1 corresponding to a gain value of a second set of gain values. The gain controller 216 may generate a first gain signal GS1 corresponding to a fourth gain value of the second set of gain values. The second set of gain values is less than the first set of gain values. The first set of gain values is selected when the prediction signal PR is deactivated and the second set of gain values is selected when the prediction signal PR is activated. Each gain value in the second set of gain values is arranged in a decreasing order such that the fourth gain value is greater than a fifth gain value of the second set of gain values. When the first gain signal GS1 is generated such that the first gain signal GS1 corresponds to the fourth gain value, the gain controller 216 indicates the LNA 202 to amplify the first power signal PS1 by the fourth gain value.

Further, the gain controller 216 is configured to receive the first peak signal PK1. When the gain controller 216 receives the deactivated first peak signal PK1, the gain controller 216 is configured to terminate the adjustment of the first gain signal GS1 associated with a corresponding gain value. For example, if the gain controller 216 provides the first gain value to the LNA 202, and the gain controller 216 receives the deactivated first peak signal PK1, the gain controller 216 terminates the adjustment of the first gain signal GS1 and generates the first gain signal GS1 associated with the first gain value throughout the reception of the first data packet.

When the gain controller 216 receives the activated first peak signal PK1 and the deactivated prediction signal PR, the gain controller 216 is configured to adjust the gain value of the first gain signal GS1, and generate the first gain signal GS1 associated with a lower gain value of the first set gain values. For example, when the gain controller 216 provides the first gain signal GS1 associated with the first gain value, and the gain controller 216 receives the activated first peak signal PK1 and the deactivated prediction signal PR, the gain controller 216 is configured to adjust the first gain signal GS1 and generate the first gain signal GS1 with the second gain value (i.e., the lower gain value), and provide the first gain signal GS1 to the LNA 202. Further, the gain controller 216 is configured to continuously monitor the first peak signal PK1 and the prediction signal PR. If the first peak signal PK1 remains activated and the prediction signal PR remains deactivated, the gain controller 216 generates the first gain signal GS1 associated with a third gain value of the first set of gain values. Thus, the gain controller 216 keeps adjusting the gain values of the first gain signal GS1 until the gain controller 216 receives the deactivated first peak signal PK1.

When the gain controller 216 receives the activated first peak signal PK1 and the activated prediction signal PR, the gain controller 216 is configured to adjust the gain value of the first gain signal GS1 from the second set of gain values such that the gain controller 216 generates the first gain signal GS1 associated with a lower gain value of the second set of gain values. For example, when the gain controller 216 has provided the first gain signal GS1 associated with the fourth gain value to the LNA 202 and the first peak signal PK1 and the prediction signal PR remain activated, the gain controller 216 can be configured to adjust the first gain signal GS1 and generate the first gain signal GS1 with the fifth gain value (i.e., the lower gain value), and provide the first gain signal GS1 with the fifth gain value to the LNA 202. The gain controller 216 can be configured to continuously monitor the first peak signal PK1 and the prediction signal PR. If the first peak signal PK1 and the prediction signal PR continue to remain activated, the gain controller 216 generates the first gain signal GS1 associated with a sixth gain value (i.e., lower than the fifth gain value) of the second set of gain values. Therefore, the gain controller 216 can be configured to receive continuous feedback of the gain values of the first gain signal GS1, and the gain controller 216 is configured to adjust, i.e., reduce the gain values until the gain controller 216 receives the deactivated first peak signal PK1. Therefore, the third signal strength associated with the amplified signal AS needs to be less than the third threshold value to avoid saturation of the LNA 202. Further, the gain controller 216 adjusts the gain values associated with the first gain signal GS1 based on the prediction signal PR to mitigate the interference of power associated with the reception of the first data packet and the power associated with the transmission of the first control packet. After the adjustment of gain values associated with the first gain signal GS1, the saturation of LNA 202 which generates the amplified signal AS is avoided.

The gain controller 216 can be further configured to generate and provide the second gain signal GS2 associated with a third set of gain values, to the narrow band amplifier 208. Each gain value in the third set of gain values is arranged in a decreasing order such that a seventh gain value is greater than an eighth gain value of the third set of gain values. The gain value of the third set of gain values is selected based on the gain value associated with the first gain signal GS1 to compensate the corresponding gain value to generate the first baseband signal BB1 at a desired amplitude. For example, the gain controller 216 is configured to generate the second gain signal GS2 associated with a higher gain value from the third set of gain values (i.e., the seventh gain value) if the first gain signal GS1 is associated with a lower gain value (i.e., any gain value of the first through sixth gain values), to compensate the first gain signal GS1, and acquire the desired amplitude of the first baseband signal BB1. If the first gain signal GS1 is associated with a higher gain value, the gain controller 216 is configured to generate the second gain signal GS2 associated with a lower gain value from the third set of gain values.

In a scenario, the gain controller 216 is configured to generate and provide the seventh gain value of the third set of gain values to the narrow band amplifier 208. Further, the gain controller 216 is configured to receive the second peak signal PK2. When the gain controller 216 is configured to receive the deactivated second peak signal PK2, the gain controller 216 is configured to retain the seventh gain value of the third set of gain values as a constant gain value for the second gain signal GS2 and provide the second gain signal GS2 with the seventh gain value to the narrow band amplifier 208. When the second gain signal GS2 is generated such that the second gain signal GS2 corresponds to the seventh gain value, the gain controller 216 indicates the narrow band amplifier 208 to amplify the filtered signal FS by the seventh gain value.

When the gain controller 216 is configured to receive the activated second peak signal PK2, the gain controller 216 is configured to generate the second gain signal GS2 associated with a fourth set of gain values. Thus, when the second peak signal PK2 is deactivated, the second gain signal GS2 retains the gain value (i.e., the seventh gain value) of the third set of gain values and when the second peak signal PK2 is activated, the second gain signal GS2 is associated with the fourth set of gain values. The fourth set of gain values is less than the third set of gain values. For example, if the gain controller 216 generates the second gain signal GS2 associated with the seventh gain value based on the gain value of the first gain signal GS1, and the gain controller 216 receives the activated second peak signal PK2, the gain controller 216 is configured to adjust (i.e., reduce) the gain value of the second gain signal GS2 and generate the second gain signal GS2 associated with a gain value of the fourth set of gain values. Each gain value in the fourth set of gain values is arranged in a decreasing order such that a tenth gain value is greater than an eleventh gain value of the fourth set of gain values. In such a scenario, the gain controller 216 generates the second gain signal GS2 associated with the tenth gain value. When the second gain signal GS2 is generated such that the second gain signal GS2 is associated with the tenth gain value, the gain controller 216 indicates the narrow band amplifier 208 to amplify the filtered signal FS by the tenth gain value.

If the second peak signal PK2 remains activated, the gain controller 216 is configured to adjust the gain value of the second gain signal GS2 from the fourth set of gain values. For example, when the gain controller 216 has provided the second gain signal GS2 associated with the tenth gain value to the narrow band amplifier 208, and the second peak signal PK2 remains activated, the gain controller 216 is configured to adjust the second gain signal GS2 to a lower gain value of the fourth set of gain values, i.e., the eleventh gain value, and provide the second gain signal GS2 with the eleventh gain value to the narrow band amplifier 208. The gain controller 216 is configured to adjust the gain value of the second gain signal GS2 until the gain controller 216 receives the deactivated second peak signal PK2.

When the gain controller 216 is configured to receive the deactivated second peak signal PK2, the gain controller 216 is configured to terminate the gain value adjustment of the second gain signal GS2, and generate the second gain signal GS2 associated with one of the gain values of the third or fourth set of gain values. For example, when the gain controller 216 generates the second gain signal GS2 associated with the tenth gain value, and if the gain controller 216 receives the deactivated second peak signal PK2 and the deactivated second indication signal IS2, the gain controller 216 is configured to retain the second gain signal GS2 associated with the tenth gain value of the fourth set of gain values. If the gain controller 216 receives either the activated second peak signal PK2 or the activated second indication signal IS2, the gain controller 216 is configured to generate the second gain signal GS2 associated with another gain value of the fourth set of gain values.

The gain controller 216 further indicates the narrow band amplifier 208 to amplify the filtered signal FS by the second gain signal GS2, associated with the gain value of the fourth set of gain values. The gain controller 216 is hence configured to reduce the gain values of the second gain signal GS2 until the gain controller 216 receives the deactivated second peak signal PK2 and the deactivated second indication signal IS2. Further, as the first baseband signal BB1 is generated by the narrow band amplifier 208, after the adjustment of gain values associated with the second gain signal GS2, the saturation of the narrow band amplifier 208 is avoided.

Therefore, the gain controller 216 is configured to adjust the gain values of first and second gain signals GS1 and GS2 until the second through fourth signal strengths associated with the first digital signal DS1, the amplified signal AS, and the first baseband signal BB1, are below the second through fourth threshold values, respectively.

When the second through fourth signal strengths are less than the second through fourth threshold values, respectively, the current gain values of the first and second gain signals GS1 and GS2 are retained for the entire duration of the reception of the first data packet of the first set of data packets FSDP. Thus, when the reception of the first data packet is initiated, the gain controller 216 tunes the gain values of the first and second gain signals GS1 and GS2 with the retained gain values such that the signal-to-noise ratio of the first baseband signal BB1 is greater than the signal-to-noise ratio of the first power signal PS1, the interference of the power associated with the reception of the first data packet and the power associated with the transmission of the first control packet is mitigated, and the corruption of the first data packet is mitigated.

FIGS. 3A-3F, collectively, represent a flow chart 300 that illustrates a communication method performed by the communication system 102 of FIG. 1 in accordance with an embodiment of the present disclosure.

At step 302, the first device 104 initiates the reception of the first data packet from the third device 110. At step 304, the first device 104 generates the first power signal PS1. In an example, a header of the first data packet is received by the first device 104 and the first power signal PS1 is generated based on the received header. At step 306, the first baseband circuit 120 determines the first signal strength of the first power signal PS1. At step 308, the first baseband circuit 120 determines whether the first signal strength is greater than the first threshold value. If at step 308, the first baseband circuit 120 determines that the first signal strength is greater than the first threshold value, step 310 is executed. If at step 308, the first baseband circuit 120 determines that the first signal strength is less than the first threshold value, step 312 is executed.

At step 310, the first baseband circuit 120 generates a first indication signal IS1 at a logic high state to indicate that the first signal strength associated with the power signal PS1 is greater than the first threshold value. At step 312, the first baseband circuit 120 generates the first indication signal IS1 at a logic low state to indicate that the first signal strength of the first power signal PS1 is less than the first threshold value. At step 314, the gain adjustment circuit 108 receives the first indication signal IS1.

At step 316, the first device 104 generates the first state information SI1. At step 318, the second device 106 generates the second state information SI2. At step 320, the gain adjustment circuit 108 receives the first and second state information SI1 and SI2. At step 322, the gain adjustment circuit 108 generates the arbiter signal AR based on the first and second state information SI1 and SI2. At step 324, the gain adjustment circuit 108 determines the duty cycle of transmission of the second device 106. At step 326, the gain adjustment circuit 108 predicts the time of transmission of the first control packet by the second device 106.

At step 328, the gain adjustment circuit 108 determines whether the predicted time of transmission of the first control packet overlaps with the time period of reception of the first data packet. If at step 328, the gain adjustment circuit 108 determines that the predicted time of transmission of the first control packet overlaps with the time period of reception of the first data packet, steps 330 and 332 are executed. In an example, the header of the first data packet is received at a time instant T1, i.e., the initiation of the reception of the first data packet occurs at the time instant T1, and the entire first data packet is received in a first-time interval T1-T7, i.e., T1-T7 is the time period of reception of the first data packet. If the initiation of the transmission of the first control packet occurs at time instant T4 and the entire first control packet is transmitted in a second-time interval T4-T6 thus an overlap of the reception of the first data packet occurs with the transmission of the first control packet in the time interval T4-T6. Thus, the predicted time of transmission of the first control packet overlaps with the time period of reception of the first data packet. If at step 328, the gain adjustment circuit 108 determines that the predicted time of transmission of the first control packet non-overlaps with the time period of reception of the first data packet, step 334 is executed. In an example, if the first data packet is received in a third-time interval T12-T19, and the transmission of the first control packet does not occur in the third time interval, thus the time period reception of the first data packet does not overlap with the transmission of the first control packet. Although the present embodiment discloses that the first control packet is transmitted in the second-time interval T4-T6, the scope of the present disclosure is not limited to it. In various other embodiments, the entire first control packet can be transmitted at a time instance T4, without deviating from the scope of the present disclosure.

At step 330, the gain adjustment circuit 108 generates the prediction signal PR at a logic high state. At step 332, the second device 106 generates and initiates transmission of the first control packet to the fourth device 112 at the predicted time of transmission. At step 334, the gain adjustment circuit 108 generates the prediction signal PR at a logic low state. Step 335 is executed after step 332. Step 336 is executed after step 334. At step 335, the gain adjustment circuit 108 determines whether the first indication signal IS1 is at a logic high state. If at step 335, the gain adjustment circuit 108 determines that the first indication signal IS1 is at a logic high state, step 338 is executed. If at step 335, the gain adjustment circuit 108 determines that the first indication signal IS1 is not at a logic high state, step 336 is executed. At step 336, the gain adjustment circuit 108 generates the first gain signal GS1 associated with a gain value (such as the first gain value) of the first set of gain values, and step 340 is executed.

At step 338, the gain adjustment circuit 108 generates the first gain signal GS1 associated with a gain value (such as the fourth gain value) of the second set of gain values, and step 340 is executed. At step 340, the first device 104 receives the first gain signal GS1. At step 342, the first device 104 amplifies the first power signal PS1 based on the first gain signal GS1 to generate the amplified signal AS. At step 344, the gain adjustment circuit 108 receives the amplified signal AS. At step 346, the gain adjustment circuit 108 determines the third signal strength of the amplified signal AS.

At step 348, the gain adjustment circuit 108 generates the first peak signal PK1. At step 350, the gain adjustment circuit 108 determines whether the third signal strength is greater than the third threshold value. If at step 350, the gain adjustment circuit 108 determines that the third signal strength is greater than the third threshold value, step 352 is executed.

At step 352, the gain adjustment circuit 108 determines whether the prediction signal PR is at a logic high state. If at step 352, the gain adjustment circuit 108 determines that the prediction signal PR is at a logic high state, step 354 is executed.

At step 354, the gain adjustment circuit 108 re-generates the first gain signal GS1 associated with another gain value (such as the fifth gain value) of the second set of gain values. If at step 352, the gain adjustment circuit 108 determines that the prediction signal PR is at a logic low state, step 356 is executed. At step 356, the gain adjustment circuit 108 re-generates the first gain signal GS1 associated with another gain value (such as the second gain value) of the first set of gain values. Step 340 is executed after steps 354 and 356. If at step 350, the gain adjustment circuit 108 determines that the third signal strength is less than the third threshold value, step 358 is executed.

At step 358, the first device 104 generates the mixed signal MS based on the amplified signal AS. At step 360, the first device 104 filters the mixed signal MS to generate the filtered signal FS. At step 362, the gain adjustment circuit 108 generates the second gain signal GS2 associated with a gain value (such as a seventh gain value) of the third set of gain values.

At step 364, the first receiver 116 of the first device 104 receives the second gain signal GS2. At step 366, the first receiver 116 amplifies the filtered signal FS based on the second gain signal GS2. At step 368, the first receiver 116 of the first device 104 generates the first baseband signal BB1. At step 370, the gain adjustment circuit 108 receives the first baseband signal BB1. At step 372, the gain adjustment circuit 108 determines the fourth signal strength of the first baseband signal BB1.

At step 374, the gain adjustment circuit 108 generates the second peak signal PK2. At step 376, the gain adjustment circuit 108 determines whether the fourth signal strength is greater than the fourth threshold value. If at step 376, the gain adjustment circuit 108 determines that the fourth signal strength is greater than the fourth threshold value, step 378 is executed. At step 378, the gain adjustment circuit 108 generates the second gain signal GS2 associated with a gain value (such as a tenth gain value) of the fourth set of gain values. Step 364 is executed after step 378. Steps 364 to 376 are executed until the gain adjustment circuit 108 determines that the fourth signal strength becomes equal or less than the fourth threshold value.

If at step 376, the gain adjustment circuit 108 determines that the fourth signal strength is less than the fourth threshold value, step 380 is executed. At step 380, the first device 104 converts the first baseband signal BB1 to generate the first digital signal DS1. At step 382, the first device 104 determines the second signal strength of the first digital signal DS1.

At step 384, the first device 104 determines whether the second signal strength is greater than the second threshold value. If at step 384, the first device 104 determines that the second signal strength is greater than the second threshold value, step 386 is executed. At step 386, the first device 104 provides the second indication signal IS2 at logic high state to the gain adjustment circuit 108. At step 388, the gain adjustment circuit 108 re-generates the second gain signal GS2 associated with a gain value (such as the eleventh gain value) of the fourth set of gain values. Step 380 is executed after step 388. Steps 380-384 are executed until the first device 104 determines that the second signal strength becomes equal to or less than the second threshold value.

If at step 384, the first device 104 determines that the second signal strength is not greater than the second threshold value, step 390 is executed. At step 390, the first device 104 provides the second indication signal IS2 at logic low state to the gain adjustment circuit 108, thereby indicating that the gain values for the first and second gain signals GS1 and GS2 need not be further adjusted.

Thus, the gain adjustment circuit 108 of the present disclosure generates the plurality of gain signals GS1 and GS2 based on the predicted time of transmission of the first control packet. Such plurality of gain signals GS1 and GS2 are generated by utilizing the gain adjustment circuit 108 that includes the arbiter circuit 212 and the predictor circuit 214, in a feedback loop with the first receiver 116 of the first device 104. The first and second gain signals GS1 and GS2 are affixed to a corresponding gain value such that the saturation of the LNA 202 and the narrow band amplifier 208 included in the first receiver 116 is avoided. Thus, the signal interference associated with the transmission of the first control packet and the reception of the first data packet is mitigated due to the amplification of the first power signal PS1 based on the first gain signal GS1, and the amplification of the first baseband signal BB1 based on the second gain signal GS2, thereby increasing the signal-to-noise ratio of the first baseband signal BB1 with respect to the first power signal PS1. Thus, the signal-to-noise ratio of the first baseband signal BB1 of the first device 104 of the communication system 102 is improved over that of conventional communication systems for mitigating interference as the conventional communication systems do not generate the plurality of gain signals based on a predicted time of transmission of a control packet. Further, the gain adjustment circuit 108 of the present disclosure generates the first gain signal GS1 associated with low gain values when the predicted time of transmission of the first control packet overlaps with the time period of reception of the first data packet, and hence the signal-to-noise ratio of the first baseband signal BB1 is improved over that of conventional communication systems that generate high gain values during an overlap of transmission and reception of control and data packets, respectively. Further, the corruption of the first data packet is mitigated since the power associated with the first control packet is attenuated and the power associated with the first data packet is amplified.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A gain adjustment circuit comprising:
   circuitry configured to (i) receive a baseband signal from a first device, wherein the baseband signal is generated by the first device based on first and second gain signals and a power signal associated with a reception of a first data packet by the first device, (ii) receive first state information from a second device, wherein the first state information includes previous transmission information of the second device, (iii) predict, based on the first state information, a time of transmission of a first control packet by the second device, (iv) adjust, based on the baseband signal and the predicted time of transmission, the first and second gain signals; and (v) provide the adjusted first and second gain signals to the first device.

2. The gain adjustment circuit of claim 1, wherein the circuitry comprise:
   an arbiter circuit that is configured to receive the first state information, and second state information from the first device, and generate an arbiter signal based on the first state information and the second state information, wherein the second state information includes reception information of the first data packet by the first device, wherein the arbiter signal is indicative of a time of transmission of a subset of control packets by the second device and a time of reception of the first data packet by the first device, wherein the previous transmission information includes the time of transmission of the subset of control packets, and wherein the subset of control packets is transmitted by the second device before the first control packet is transmitted by the second device;
   a predictor circuit that is coupled with the arbiter circuit, and configured to receive the arbiter signal, determine a duty cycle of transmission of the second device based on the arbiter signal, predict the time of transmission of the first control packet based on the duty cycle of transmission, determine whether the predicted time of transmission of the first control packet overlaps with a time period of reception of the first data packet to generate a prediction signal, wherein the time period of reception is based on the time of reception of the first data packet; and
   a peak detector configured to receive an amplified signal and the baseband signal, and determine, whether first and second signal strengths of the amplified signal and the baseband signal are greater than first and second threshold values to generate first and second peak signals, respectively, wherein the amplified signal is an amplified version of the power signal.

3. The gain adjustment circuit of claim 2, wherein the circuitry further comprise a gain controller coupled with the predictor circuit and the peak detector, wherein the gain controller is configured to receive a first indication signal from the first device, the first and second peak signals and the prediction signal, and provide the first and second gain signals to the first device, and wherein the first indication signal is generated based on a determination that a third signal strength of a digital version of the baseband signal is greater than a third threshold value.

4. The gain adjustment circuit of claim 3, wherein when the first peak signal indicates to the gain controller that the first signal strength associated with the amplified signal is greater than the first threshold value, and the prediction signal indicates to the gain controller that the predicted time of transmission of the first control packet non-overlaps with the time period of reception of the first data packet, the gain controller generates the first gain signal such that the first gain signal indicates to the first device to amplify the power signal by a first gain value of a first set of gain values.

5. The gain adjustment circuit of claim 4, wherein when the prediction signal indicates to the gain controller that the predicted time of transmission of the first control packet overlaps with the time period of reception of the first data packet, the gain controller generates the first gain signal such that the first gain signal indicates to the first device to amplify the power signal by a second gain value of a second set of gain values, wherein the second set of gain values is lower than the first set of gain values, and wherein the amplification of the power signal by the second gain value mitigates signal interference between the reception of the first data packet by the first device and a transmission of the first control packet by the second device.

6. The gain adjustment circuit of claim 3, wherein when the second peak signal and the first indication signal indicates to the gain controller that the second signal strength associated with the baseband signal is less than the second threshold value, and the first indication signal indicates to the gain controller that the third signal strength associated with the digital version of the baseband signal is less than the third threshold value, the gain controller generates the second gain signal such that the second gain signal indicates to the first device to amplify a filtered signal by a third gain value of a third set of gain values, and wherein the filtered signal is a filtered version of the amplified signal.

7. The gain adjustment circuit of claim 6, wherein when the third signal strength associated with the digital version of the baseband signal is greater than the third threshold value, the gain controller generates the second gain signal such that the second gain signal indicates to the first device to amplify the filtered signal by a fourth gain value of a fourth set of gain values, and wherein the fourth set of gain values is lower than the third set of gain values.

8. A gain adjusting method, comprising:
   receiving, by a gain adjustment circuit, a baseband signal from a first device, wherein the baseband signal is generated by the first device based on first and second gain signals and a power signal associated during a reception of a first data packet by the first device;
   receiving, by the gain adjustment circuit, first state information from a second device, wherein the first state information includes previous transmission information of the second device;
   predicting, by the gain adjustment circuit, based on the first state information, a time of transmission of a first control packet by the second device;
   adjusting, by the gain adjustment circuit based on the baseband signal and the predicted time of transmission, the first and second gain signals; and
   providing by the gain adjustment circuit, the adjusted first and second gain signals to the first device.

9. The gain adjusting method of claim 8, further comprising:
   receiving, by the gain adjustment circuit, an amplified signal from the first device, wherein the amplified signal is an amplified version of the power signal;
   determining, by the gain adjustment circuit, whether a first signal strength associated with the amplified signal is greater than a first threshold value, and a second signal strength associated with the baseband signal is greater than a second threshold value;

generating, by the gain adjustment circuit, first and second peak signals based on the first and second signal strengths, respectively; and receiving, by the gain adjustment circuit, a first indication signal, wherein the first indication signal is generated based on a determination that a third signal strength of a digital version of the baseband signal is greater than a third threshold value.

10. The gain adjusting method of claim 9, further comprising:
receiving, by the gain adjustment circuit, second state information, wherein the second state information includes reception information of the first data packet by the first device;
generating, by the gain adjustment circuit, an arbiter signal based on the first state information and the second state information, wherein the arbiter signal is indicative of the time of transmission of a subset of control packets and a time of reception of the first data packet, wherein the previous transmission information includes the time of transmission of the subset of control packets, and wherein the subset of control packets is transmitted by the second device before the first control packet is transmitted by the second device;
determining based on the arbiter signal, by the gain adjustment circuit, a duty cycle of transmission of the second device to predict the time of transmission of the first control packet; and
determining, by the gain adjustment circuit, whether the predicted time of transmission of the first control packet overlaps with a time period of reception of the first data packet to generate a prediction signal, wherein the time period of reception is based on the time of reception of the first data packet.

11. The gain adjusting method of claim 10, wherein when the first peak signal indicates that the first signal strength is greater than the first threshold value, and the prediction signal indicates that the predicted time of transmission of the first control packet non-overlaps with the time period of reception of the first data packet, the first gain signal is adjusted such that the adjusted first gain signal indicates to the first device to amplify the power signal by a first gain value of a first set of gain values, wherein when the prediction signal indicates that the predicted time of transmission of the first control packet overlaps with the time period of reception of the first data packet, the first gain signal is adjusted such that the adjusted first gain signal indicates to the first device to amplify the power signal by a second gain value of a second set of gain values, and wherein the first gain value is greater than the second gain value.

12. The gain adjusting method of claim 10, wherein (i) when the second peak signal and the first indication signal indicate to the gain adjustment circuit that the second signal strength is less than the second threshold value, and the third signal strength is less than the third threshold value, the second gain signal is adjusted by the gain adjustment circuit such that the adjusted second gain signal indicates to the first device to amplify a filtered signal by a third gain value of a third set of gain values, wherein the filtered signal is a filtered version of the amplified signal, and (ii) when the third signal strength is greater than the third threshold value, the second gain signal is adjusted by the gain adjustment circuit such that the adjusted second gain signal indicates to the first device to amplify the filtered signal by a fourth gain value of a fourth set of gain values, and wherein the third gain value is greater than the fourth gain value.

13. A communication system, comprising:
first and second devices, wherein the second device is configured to generate first state information that includes previous transmission information of the second device, and wherein the first device is configured to:
receive a plurality of gain signals; and
generate, based on the plurality of gain signals and a power signal, a baseband signal, wherein the power signal is associated with a reception of a first data packet by the first device; and
a gain adjustment circuit configured to be coupled with the first and second devices, wherein the gain adjustment circuit is further configured to:
receive the baseband signal and the first state information;
predict, based on the first state information, a time of transmission of a first control packet by the second device;
adjust, based on the baseband signal and the predicted time of transmission, the plurality of gain signals; and
provide the plurality of adjusted gain signals to the first device.

14. The communication system of claim 13, wherein the first device comprises a receiver that is configured to receive the first data packet and the plurality of gain signals, and generate the baseband signal, and wherein the receiver comprises:
a low noise amplifier that is configured to receive a first gain signal of the plurality of gain signals and the power signal, and amplify the power signal based on the first gain signal to generate an amplified signal, wherein the amplified signal has a first frequency;
a mixer circuit that is coupled with the low noise amplifier, and configured to receive the amplified signal, and generate a mixed signal based on the amplified signal such that the mixed signal has a second frequency, wherein the first frequency is greater than the second frequency;
a filter circuit that is coupled with the mixer circuit, and configured to receive the mixed signal, and filter the mixed signal to generate a filtered signal; and
a narrow band amplifier that is coupled with the filter circuit, and configured to receive the filtered signal and a second gain signal of the plurality of gain signals, and amplify the filtered signal based on the second gain signal to generate the baseband signal.

15. The communication system of claim 14, wherein the first device further comprises:
an analog-to-digital converter (ADC) that is coupled with the narrow band amplifier, and configured to receive the baseband signal and convert the baseband signal to generate a digital signal; and
a baseband circuit that is coupled with the ADC, and configured to receive the digital signal, determine a first signal strength associated with the digital signal, and determine, whether the first signal strength of the digital signal is greater than a first threshold value to generate a first indication signal, and generate and provide second state information associated with the reception of the first data packet to the gain adjustment circuit.

16. The communication system of claim 15, wherein the gain adjustment circuit further comprises:
a gain controller that is coupled with the baseband circuit, the low noise amplifier, and the narrow band amplifier, and configured to receive the first indication signal, first and second peak signals, and a prediction signal, and generate and provide the plurality of gain signals to the low noise amplifier and the narrow band amplifier, wherein the prediction signal indicates whether the predicted time of transmission of the first control packet overlaps with a time period of reception of the first data packet by the receiver;

an arbiter circuit that is coupled with the baseband circuit, and configured to receive the first state information and the second state information, and generate an arbiter signal based on the first state information and the second state information, wherein the arbiter signal is indicative of the time of transmission of a subset of control packets by the second device and a time of reception of the first data packet by the first device, wherein the previous transmission information includes the time of transmission of the subset of control packets, and wherein the subset of control packets is transmitted by the second device before the first control packet is transmitted by the second device;

a predictor circuit that is coupled with the arbiter circuit and the gain controller, and configured to receive the arbiter signal, determine a duty cycle of transmission of the second device based on the arbiter signal, predict the time of transmission of the first control packet based on the duty cycle of transmission, determine whether the predicted time of transmission of the first control packet overlaps with the time period of reception of the first data packet to generate the prediction signal, and provide the prediction signal to the gain controller, wherein the time period of reception is based on the time of reception of the first data packet; and a peak detector that is coupled with the low noise amplifier and the narrow band amplifier, and configured to receive the amplified signal and the baseband signal, and determine, whether second and third signal strengths of the amplified signal and the baseband signal are greater than second and third threshold values to generate and provide the first and second peak signals to the gain controller.

17. The communication system of claim 16, wherein when the first peak signal indicates to the gain controller that the second signal strength associated with the amplified signal is greater than the second threshold value, and the prediction signal indicates to the gain controller that the predicted time of transmission of the first control packet non-overlaps with the time period of reception of the first data packet, the gain controller generates the first gain signal such that the first gain signal indicates to the low noise amplifier to amplify the power signal by a first gain value of a first set of gain values.

18. The communication system of claim 17, wherein when the prediction signal indicates to the gain controller that the predicted time of transmission of the first control packet overlaps with the time period of reception of the first data packet, the gain controller generates the first gain signal such that the first gain signal indicates to the low noise amplifier to amplify the power signal by a second gain value of a second set of gain values, and wherein the second gain value is lower than the first gain value.

19. The communication system of claim 16, wherein when the second peak signal and the first indication signal indicates to the gain controller that the third signal strength associated with the baseband signal is less than the third threshold value, and the first indication signal indicates to the gain controller that the first signal strength associated with the digital signal is less than the first threshold value, the gain controller generates the second gain signal such that the second gain signal indicates to the narrow band amplifier to amplify the filtered signal by a third gain value of a third set of gain values.

20. The communication system of claim 19, wherein when the first signal strength associated with the digital signal is greater than the first threshold value, the gain controller generates the second gain signal such that the second gain signal indicates to the narrow band amplifier to amplify the filtered signal by a fourth gain value of a fourth set of gain values, and wherein the fourth gain value is lower than the third gain value.

* * * * *